US012308342B2

(12) United States Patent
Oh et al.

(10) Patent No.: US 12,308,342 B2
(45) Date of Patent: May 20, 2025

(54) BONDING APPARATUS AND BONDING METHOD

(71) Applicant: SAMSUNG DISPLAY CO., LTD., Yongin-si (KR)

(72) Inventors: Myong Soo Oh, Yongin-si (KR); Doo San Park, Yongin-si (KR); Hyun Chul Jin, Yongin-si (KR); Hee Jong Shin, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/147,990

(22) Filed: Dec. 29, 2022

(65) Prior Publication Data
US 2023/0133340 A1    May 4, 2023

Related U.S. Application Data

(62) Division of application No. 16/573,086, filed on Sep. 17, 2019, now abandoned.

(30) Foreign Application Priority Data

Nov. 5, 2018  (KR) .................. 10-2018-0134621

(51) Int. Cl.
*H01L 23/00*   (2006.01)
*H05K 1/18*    (2006.01)

(52) U.S. Cl.
CPC .............. *H01L 24/86* (2013.01); *H01L 24/79* (2013.01); *H05K 1/181* (2013.01); *H05K 2201/10128* (2013.01)

(58) Field of Classification Search
CPC ......... H01L 24/86; H01L 24/79; H01L 24/50; H01L 2224/50; H01L 2224/793; H01L 2224/86203; H01L 2224/86862; H01L 2224/86; H01L 21/67092; H01L 24/64; H01L 24/67; H01L 24/741; H05K 1/181; H05K 2201/10128; H05K 3/323; G02F 1/1303; G02F 1/1345
See application file for complete search history.

(56) References Cited

U.S. PATENT DOCUMENTS 5,660,318 A    8/1997  Jung ................. H01L 24/80
                                            228/6.2
6,310,299 B1 * 10/2001  Kim .................. G02F 1/13452
                                            174/256

(Continued)

FOREIGN PATENT DOCUMENTS

CN    112310165 A    2/2021
JP    2014068040 A   4/2014
(Continued)

*Primary Examiner* — Bitew A Dinke
(74) *Attorney, Agent, or Firm* — CANTOR COLBURN LLP

(57) ABSTRACT

A bonding apparatus includes: an anisotropic conductive film ("ACF") attachment unit which attaches a first ACF and a second ACF onto a display panel assembly; a compression unit which compresses a first chip-on-film ("COF") on the first ACF and compresses a second COF on the second ACF; and a buffer unit which rotates the display panel assembly, on which the first ACF and the second COF are compressed, on a plane.

18 Claims, 6 Drawing Sheets

(56) References Cited

U.S. PATENT DOCUMENTS

| | | | |
|---|---|---|---|
| 8,451,415 B2 | 5/2013 | Shin | G02F 1/13452 349/150 |
| 8,769,051 B2 | 8/2014 | Choi | |
| 8,796,051 B2 | 8/2014 | Choi | H01L 24/75 438/26 |
| 10,792,754 B2 | 10/2020 | Jung | G02F 1/1303 |
| 10,886,643 B2* | 1/2021 | Oh | G06F 3/041 |
| 11,135,779 B2 | 10/2021 | Lee | B23K 20/10 |
| 11,201,133 B2 | 12/2021 | Jang | H01L 27/3276 |
| 11,304,293 B2 | 4/2022 | Lee et al. | |
| 2005/0122462 A1* | 6/2005 | Park | H05K 3/361 349/149 |
| 2005/0127936 A1* | 6/2005 | Chen | G01R 27/205 324/760.01 |
| 2005/0253993 A1* | 11/2005 | Chen | G02F 1/13452 349/152 |
| 2008/0079889 A1* | 4/2008 | Lee | G02F 1/13452 445/24 |
| 2011/0122356 A1* | 5/2011 | Saimen | H05K 3/361 349/149 |
| 2011/0134621 A1* | 6/2011 | Saimen | G02F 1/13452 361/748 |
| 2011/0187686 A1* | 8/2011 | Kim | C08F 2/50 522/170 |
| 2012/0236514 A1* | 9/2012 | Saimen | G02F 1/13452 361/749 |
| 2013/0312907 A1 | 11/2013 | Oh | B32B 38/1858 156/382 |
| 2014/0106484 A1 | 4/2014 | Choi | H01L 33/483 156/499 |
| 2014/0140029 A1 | 5/2014 | Kim | H05K 3/323 361/783 |
| 2017/0229417 A1* | 8/2017 | Yamaguchi | H01L 24/83 |
| 2017/0332493 A1 | 11/2017 | Yamaguchi | H05K 13/04 |
| 2017/0374740 A1* | 12/2017 | Yamaguchi | G02F 1/13306 |
| 2018/0004030 A1* | 1/2018 | Yamaguchi | H01L 27/1218 |
| 2018/0068992 A1* | 3/2018 | Oh | H01L 27/124 |
| 2018/0082929 A1 | 3/2018 | Lai | H05K 1/0393 |
| 2018/0154477 A1* | 6/2018 | Jung | B23K 13/01 |
| 2018/0224676 A1* | 8/2018 | Yoshii | G02F 1/136286 |
| 2018/0228018 A1* | 8/2018 | Yoshii | G02F 1/13452 |
| 2019/0033646 A1* | 1/2019 | Shimizu | G02F 1/13452 |
| 2020/0168581 A1 | 5/2020 | Jang | H05K 3/323 |
| 2020/0373276 A1 | 11/2020 | Lee | H01L 24/83 |
| 2020/0388720 A1 | 12/2020 | Lee | G02F 1/1335 |
| 2023/0133340 A1* | 5/2023 | Oh | H01L 24/86 29/832 |

FOREIGN PATENT DOCUMENTS

| | | |
|---|---|---|
| KR | 1020110129267 A | 12/2011 |
| KR | 20130080924 A | 7/2013 |
| KR | 101473470 B1 | 12/2014 |
| KR | 101869101 B1 | 6/2018 |

* cited by examiner

BONDING APPARATUS AND BONDING METHOD

This application is a divisional of U.S. patent application Ser. No. 16/573,086, filed on Sep. 17, 2019, which claims priority to Korean patent application 10-2018-0134621, filed on Nov. 5, 2018, and all the benefits accruing therefrom under 35 U.S.C. § 119, the content of which in its entirety is herein incorporated by reference.

BACKGROUND

1. Field

The disclosure generally relates to a bonding apparatus and a bonding method.

2. Description of Related Art

In general, a display device includes a driving circuit connected to a signal line to supply signal. The driving circuit is typically implemented with an integrated circuit ("IC") chip. The IC chip may include or be configured with a chip-on-film ("COF") in which a plurality of conductive lead lines are formed on an insulating film such as polyimide. The COF may be referred to as a tape-carrier-package ("TCP"). The COF may be attached onto a display panel assembly through a tape automated bonding ("TAB") process. The driving circuit attached as described above is electrically connected to a signal line of the display panel assembly through the lead line of the COF.

The lead line of the COF may include a plurality of output-side lead lines and a plurality of input-side lead lines, which are respectively connected to an output end and an input end of the IC chip. The signal line of the display panel assembly may include a plurality of connection pads located in the vicinity of an edge of the display panel assembly. The output-side lead line of the COF may be mechanically and electrically connected to the connection pad of the display panel assembly, and the input-side lead line of the COF may be connected a printed circuit board ("PCB") for transmitting several signals to a driving IC through soldering or the like. An output end of the COF and the connection pad of the display panel assembly may be attached to each other through an anisotropic conductive film ("ACF").

SUMMARY

Embodiments provide a bonding apparatus and a bonding method, which simplifies the layout of process facilities through conveyance and rotation in a tape automated bonding ("TAB") process of a chip-on-film ("COF").

According to an embodiment of the disclosure, a bonding apparatus includes: an anisotropic conductive film ("ACF") attachment unit which attaches a first ACF and a second ACF onto a display panel assembly; a compression unit which compresses a COF on the first ACF and compresses a second COF on the second ACF; and a buffer unit which rotates the display panel assembly, on which the first ACF and the second COF are compressed.

In an embodiment, each of the ACF attachment unit, the compression unit and the buffer unit may include a conveyor which transfers the display panel assembly in a first direction toward the compression unit from the ACF attachment unit and in a second direction toward the ACF attachment unit from the compression unit.

In an embodiment, the buffer unit may be disposed prior to the ACF attachment unit, and rotate the display panel assembly transferred from the ACF attachment unit by about 180 degrees and then transfer the rotated display panel assembly to the ACF attachment unit.

In an embodiment, the ACF attachment unit may transfer the display panel assembly, to which the first ACF is attached, to the compression unit, and attach the second ACF onto the display panel assembly rotated by the buffer unit.

In an embodiment, the compression unit may transfer the display panel assembly, on which the first COF is compressed, to the ACF attachment unit, and transfer the display panel assembly, on which the second COF is compressed, to an outside.

In an embodiment, the buffer unit may be disposed prior to the compression unit, and rotate the display panel assembly transferred from the compression unit by about 180 degrees and then retransfer the rotated display panel assembly to the compression unit.

In an embodiment, the ACF attachment unit may transfer the display panel assembly, to which the first ACF is attached, to the compression unit, and attach the second ACF to the display panel assembly transferred from the compression unit.

In an embodiment, the compression unit may transfer the display panel assembly, on which the first COF and the second COF are compressed, to the buffer unit, and convey the display panel assembly rotated in the buffer unit to the ACF attachment unit.

In an embodiment, the bonding apparatus may further include: a first ACF transfer unit disposed at a side of the ACF attachment unit, where the first ACF transfer unit may provide the first ACF; and a second ACF transfer unit disposed at an opposing side of the ACF attachment unit, where the second ACF transfer unit may provide the second ACF.

In an embodiment, the bonding apparatus may further include: a first COF transfer unit disposed at a side of the compression unit, where the first COF transfer unit may provide the first COF; and a second COF transfer unit disposed at an opposing side of the compression unit, where the second COF transfer unit may provide the second COF.

In an embodiment, a connection pad on the display panel assembly may be aligned adjacent to the first ACF transfer unit, and be aligned adjacent to the second ACF transfer unit when the display panel assembly is rotated by the buffer unit.

In an embodiment, the first COF may be electrically connected to a first connection pad on the display panel assembly, and the second COF may be electrically connected to a second connection pad on the display panel assembly.

In an embodiment, the first connection pad and the second connection pad may be connected to a first sub-pixel and a second sub-pixel, respectively.

In an embodiment, the first COF and the second COF may not be aligned with each other in an extending direction of a gate line.

In an embodiment, the compression unit may include: a preliminary compression unit which preliminarily compresses the first COF on the first ACF, and preliminary compresses the second COF on the second ACF; and a primary compression unit which primarily compresses the preliminarily compressed first COF and the preliminarily compressed second COF.

According to another embodiment of the disclosure, a bonding method includes: a first TAB process including attaching a first ACF and a first COF onto a display panel assembly while the display panel assembly is transferred in a first direction; a retransferring process including conveying the display panel assembly in a second direction opposite to the first direction, and rotating the display panel assembly on a plane; and a second TAB process including attaching a second ACF and a second COF onto the display panel assembly while the rotated display panel assembly is retransferred in the first direction.

In an embodiment, the first TAB process, the retransferring process and the second TAB process may be performed by a bonding apparatus including a conveyor which conveys the display panel assembly in the first direction and the second direction.

In an embodiment, the retransferring process may include: retransferring, in the second direction, the display panel assembly transferred in the first direction; rotating the retransferred display panel assembly by about 180 degrees; and transferring the rotated display panel assembly in the first direction.

In an embodiment, the retransferring process may include: rotating the display panel assembly transferred in the first direction; and retransferring the display panel assembly in the second direction.

According to still another embodiment of the disclosure, a bonding method includes: a first TAB process including attaching a first ACF onto a display panel assembly in an ACF attachment unit, and compressing a first ACF on the first ACF in a compression unit, while the display panel assembly is transferred in a first direction; a retransferring process including retransferring the display panel assembly in a second direction opposite to the first direction, and rotating the display panel assembly on a plane; and a second TAB process including attaching a second ACF onto the display panel assembly in the ACF attachment unit, and compressing a second COF on the second ACF in the compression unit, while the rotated display panel assembly is transferred in the first direction.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

Figure 1:
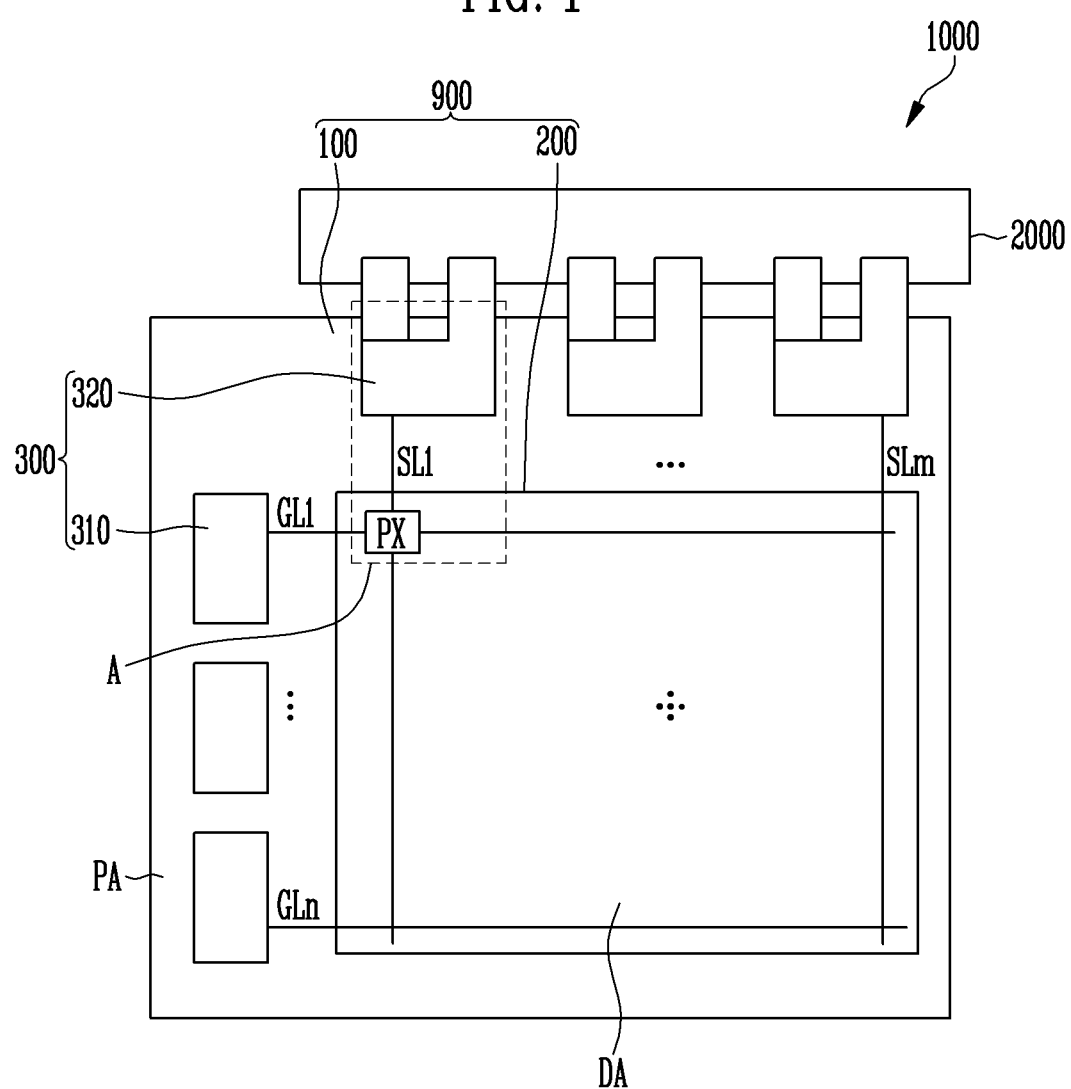
FIG. 1 is a plan view illustrating a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. In contrast, when an element is referred to as being "directly on" another element, there are no intervening elements present. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, embodiments of the invention will be described in detail with reference to the accompanying drawings.

FIG. 1 is a plan view illustrating a display device according to an embodiment of the disclosure.

Referring to FIG. 1, an embodiment of the display device 1000 includes a display panel 900 and a driver 300. The display panel 900 may include a thin film transistor ("TFT")

substrate 100 and a counter substrate 200. The display panel 900 may include a display area DA, in which the TFT substrate 100 and the counter substrate 200 overlap each other, and a peripheral area PA, in which the TFT substrate 100 and the counter substrate 200 do not overlap each other when viewed from a plan view in a thickness direction of the display panel 900.

The TFT substrate 100 may include gate lines GL1 to GLn, source lines SL1 to SLm, and sub-pixels (or pixels) PX connected to the gate lines GL1 to GLn and the source lines SL1 to SLm.

The driver 300 includes a source driving circuit 320 and a gate driving circuit 310. The driver 300 is disposed in the peripheral area PA to provide a gate signal and a source signal, which are provided from a printed circuit board ("PCB") 2000, respectively to the gate lines GL1 to GLn and the source lines SL1 to SLm.

The driver 300 is disposed on or adhered to the peripheral area PA of the display panel 900. FIG. 1 shows an embodiment in which the gate driving circuit 310 is provided or formed at only one side of the display area DA. Alternatively, the gate driving circuit 310 may be provided at one side or both sides of the display area DA to be connected to the gate lines GL1 to GLn. The source driving circuit 320 may be provided or formed at an upper side of the display area DA to be connected to one ends of the source lines SL1 to SLm.

In an embodiment, three source driving circuits 320 and three gate driving circuit 310 may be provided as illustrated in FIG. 1, but the disclosure is not limited thereto.

Figure 2:
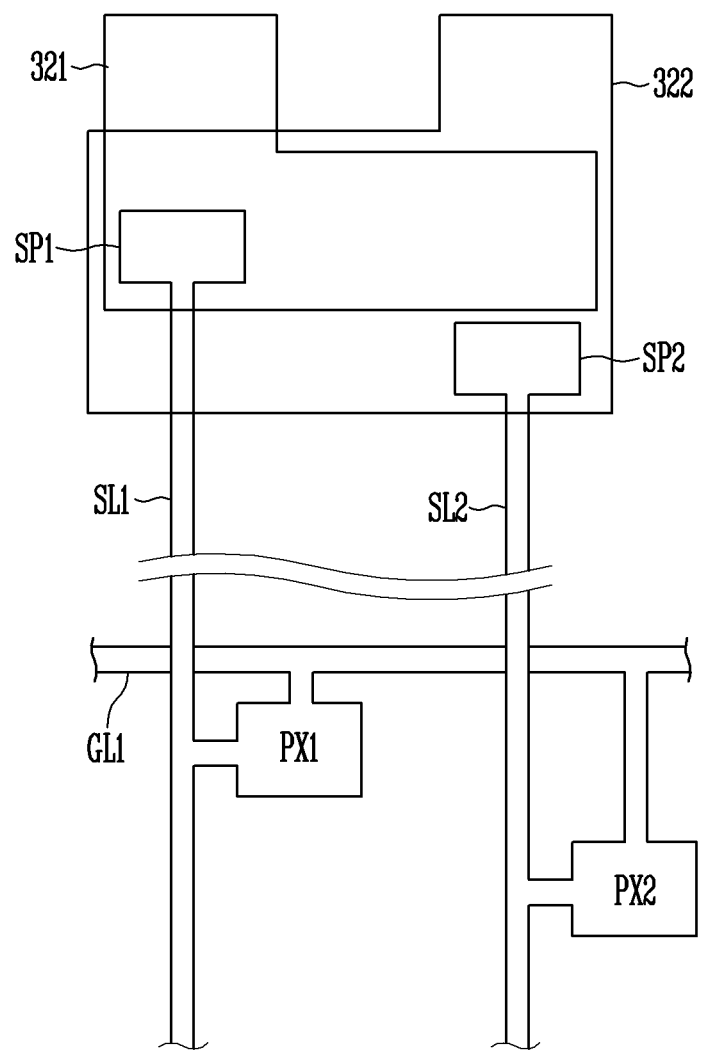
FIG. 2 is an enlarged plan view of portion A of FIG. 1.
Figure 3:
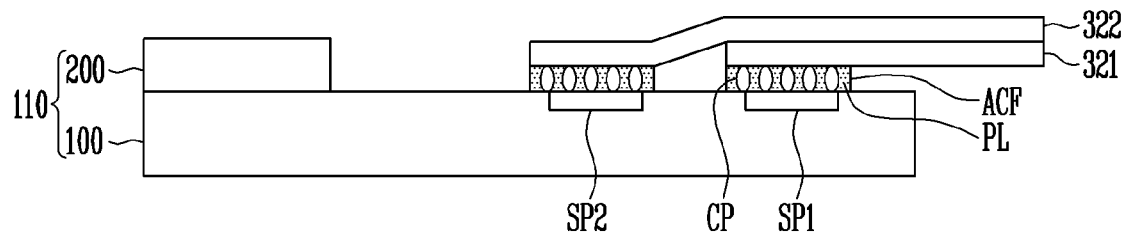
FIG. 3 is a side view of the portion A of FIG. 1.

FIG. 2 is an enlarged plan view of portion A of FIG. 1. FIG. 3 is a side view of the portion A of FIG. 1.

Referring to FIGS. 1 to 3, an embodiment of the display device 1000 includes a display panel assembly 110, source connection pads SP1 and SP2 and source driving circuits 321 and 322.

The display panel assembly 110 may include the TFT substrate 100, in which at least one sub-pixel PX1 and PX2 is disposed, and the counter substrate 200. The TFT substrate 100 may be provided in the display area DA on the counter substrate 200.

A plurality of sub-pixels PX1 and PX2 are defined or formed in the display area DA. The sub-pixels PX1 and PX2 may be connected to source lines SL1 and SL2, respectively. In an embodiment, as shown in FIG. 2, a first sub-pixel PX1 and a second sub-pixel PX2 are disposed on different rows that do not overlap each other in a horizontal direction.

The source connection pads SP1 and SP2 extending from the source lines SL1 and SL2, respectively, may be disposed or formed in the peripheral area PA on the TFT substrate 100. In an embodiment, as shown in FIG. 2, a first source connection pad SP1 extends from a first source line SL1 connected to the first sub-pixel PX1, and a second source connection pad SP2 extends from a second source line SL2 connected to the second sub-pixel PX2. In such an embodiment, the first source connection pad SP1 and the second source connection pad SP2 may be disposed on different rows that do not overlap each other in a horizontal direction. Herein, the horizontal direction may be a direction perpendicular to an extending direction of the source lines SL1 and SL2 when viewed from the plan view as shown in FIG. 2.

The source driving circuits 321 and 322 may be formed with a chip-on-film ("COF") that includes a base film (not shown) and a plurality of conductive lead lines (not shown) formed on the base film. The base film may be an insulating film including or made of polyimide or the like. The conductive lead lines may include or be made of a conductive material such as copper (Cu), nickel (Ni) or gold (Au).

Some conductive lead lines (e.g., input-side lead lines) among the conductive lead lines may be electrically connected to the source lines SL1 and SL2 through the source connection pads SP1 and SP2 when the base film is attached to the source connection pads SP1 and SP2. In an embodiment, a conductive lead line of a first source driving circuit 321 may be electrically connected to the first source connection pad SP1. In addition, a conductive lead line of a second source driving circuit 322 may be electrically connected to the second source connection pad SP2.

In an embodiment, the second source driving circuit 322 may have an area wider than that of the first source driving circuit 321 as shown in FIG. 3 to be electrically connected to the second source connection pad SP2 disposed on a row different from that of the first source connection pad SP1.

The source driving circuits 321 and 322 extend to the outside of the TFT substrate 100, to be adhered to the PCB 2000. Some conductive lead lines (e.g., output-side lead lines) provided at an extension part among the conductive lead lines of the source driving circuits 321 and 322 may be electrically connected to the PCB 2000.

The source driving circuits 321 and 322 may be attached to the source connection pads SP1 and SP2 through an anisotropic conductive film ACF, using a tape automated bonding ("TAB") process.

The anisotropic conductive film ACF may include a polymer resin PL cured by heat and conductive particles CP dispersed in the polymer resin PL. When heat and pressure are applied to the anisotropic conductive film ACF, the polymer resin PL may be melted, and the conductive particles CP may electrically connect the conductive lead lines and the source connection pads SP1 and SP2. Thus, the anisotropic conductive film ACF has both conductivity and adhesive properties. The conductive particles CP may include a metal such as carbon fiber, nickel (Ni), and platinum (Pt), or a compound thereof. In such an embodiment, the polymer resin PL may include styrene butadiene rubber, polyvinyl, butylene, epoxy resin, polyurethane, or acrylic resin.

The anisotropic conductive film ACF is interposed between the source driving circuits 321 and 322 and the source connection pads SP1 and SP2 to electrically and physically connect the source driving circuits 321 and 322 to the source connection pads SP1 and SP2.

In an embodiment, although not shown in the drawings, the gate driving circuit 310 of FIG. 1 may be attached onto the display panel assembly 110, using a method identical or similar to that used for attaching the source driving circuit 320.

Hereinafter, embodiments of a bonding apparatus and a bonding method for attaching the source driving circuits 321 and 322 onto the display panel assembly 110 will be described in detail.

Figure 4:
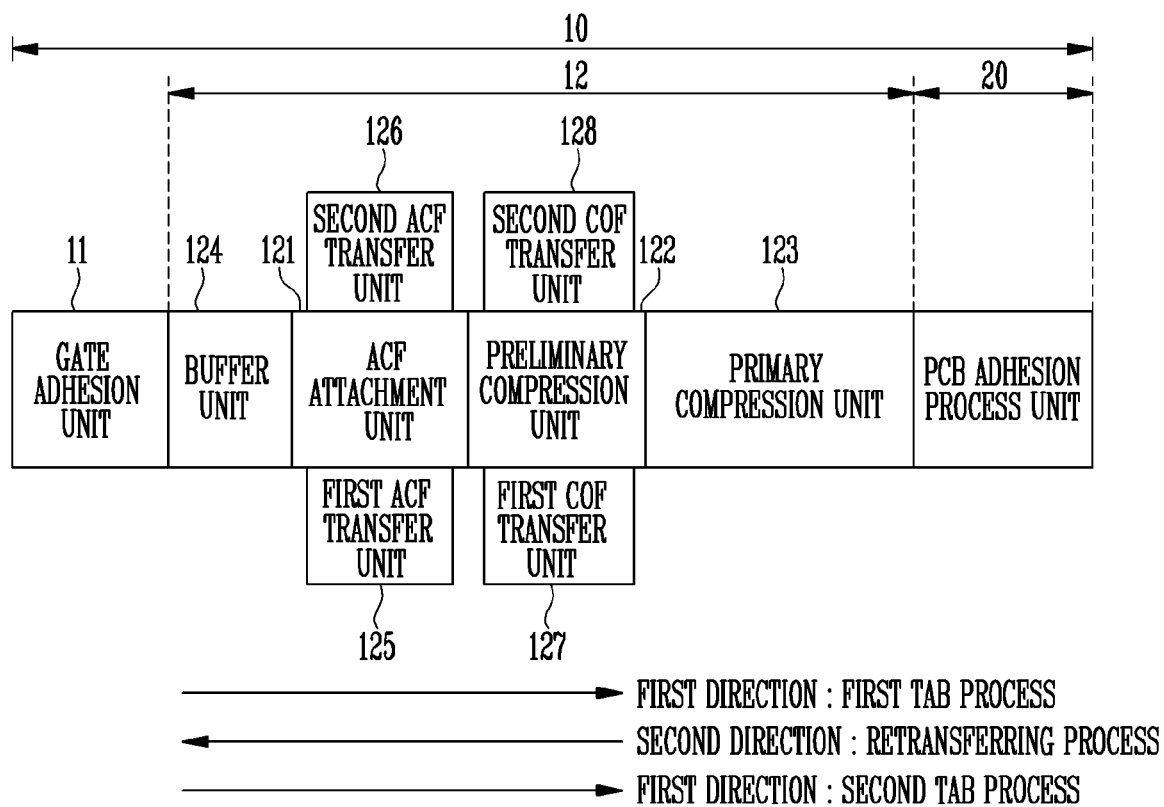
FIG. 4 is a block diagram illustrating a structure of a bonding apparatus according to an embodiment of the disclosure.
Figure 5:
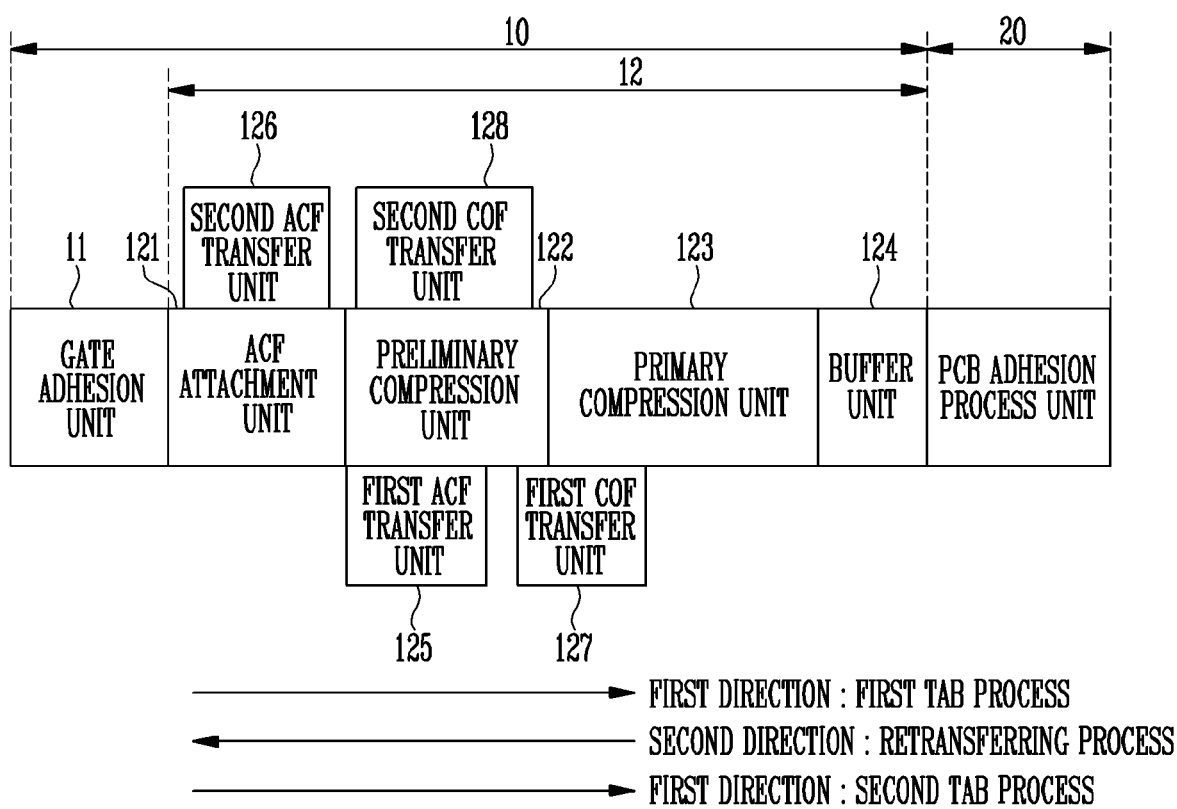
FIG. 5 is a block diagram illustrating a structure of a bonding apparatus according to an alternative embodiment of the disclosure.

FIG. 4 is a block diagram illustrating a structure of a bonding apparatus according to an embodiment of the disclosure. FIG. 5 is a block diagram illustrating a structure of a bonding apparatus according to an alternative embodiment of the disclosure. Referring to FIGS. 4 and 5, embodiments of the bonding apparatus according to the disclosure includes a COF adhesion process unit 10 and a PCB adhesion process unit 20.

A gate adhesion unit 11 performs a process of adhering or connecting the gate driving circuit 310 to a gate connection pad formed on the display panel assembly 110. The adhesion of the gate driving circuit 310 may be performed using a method identical or similar to that used for bonding the source driving circuit 320, but a detailed process method is not particularly limited. Alternatively, the gate adhesion unit 11 may be omitted.

A source adhesion unit 12 may include an ACF attachment unit 121, a preliminary compression unit 122, a primary compression unit 123, a buffer unit 124, a first ACF transfer unit 125, a second ACF transfer unit 126, a first COF transfer unit 127 and a second COF transfer unit 128.

The ACF attachment unit 121 attaches an ACF on the source connection pads SP1 and SP2 disposed or formed on the display panel assembly 110. In embodiments of the disclosure, the ACF attachment unit 121 may receive an ACF transferred from the first ACF transfer unit 125 or the second ACF transfer unit 126, and attach the transferred ACF onto the source connection pads SP1 and SP2 of the display panel assembly 110. In one embodiment, for example, the ACF attachment unit 121 may attach a first ACF transferred from the first ACF transfer unit 125 onto the source connection pads SP1 and SP2 during a first TAB process which will be described later, and attach a second ACF transferred from the second ACF transfer unit 126 onto the source connection pads SP1 and SP2 during a second TAB process which will be described later.

The preliminary compression unit 122 may preliminarily compress a COF defining the source driving circuits 321 and 322 on an ACF. In embodiments of the disclosure, the preliminary compression unit 122 may preliminarily compress, on the first ACF, a first COF for forming the first source driving circuit 321 and transferred from the first COF transfer unit 127, and preliminarily compress, on the second ACF, a second COF for forming the second source driving circuit 322 and transferred from the second COF transfer unit 128.

The primary compression unit 123 may primarily compress the preliminarily compressed COF. In embodiments of the disclosure, the primary compression unit 123 may primarily compress the first COF preliminarily compressed on the first ACF, and primarily compress the second COF preliminarily compressed on the second ACF.

In embodiments of the disclosure, the preliminary compression unit 122 and the primary compression unit 123 may include a compression head, in which a heat source is installed, and a compression tip attached to one end of the compression head to compress a COF on an ACF. The heat source of the compression head may be, for example, a heating coil, and heat generated from the heat source is applied to the ACF, such that bonding may be more effectively or easily performed through conductive particles in the ACF. The compression tip may compress the COF toward the ACF while ascending and descending through a tip lifter which may include or be configured with a cylinder or motor.

In such an embodiment, configurations of the preliminary compression unit 122 and the primary compression unit 123 are not limited to those described above. In embodiments, the preliminary compression unit 122 and the primary compression unit 123 may not include some of the above-described components, or further include other components.

The buffer unit 124 rotates the display panel assembly 110 by about 180 degrees during a retransferring process between the first TAB process and the second TAB process, which will be described later. In an embodiment, the buffer unit 124 may include an ascending/descending member for allowing the display panel assembly 110 to ascend/descend and a rotating member for rotating the display panel assembly 110. In one embodiment, for example, the ascending/descending member may hold the display panel assembly 110 and allow the display panel assembly 110 held by pressure of the cylinder or rotary power of the motor to ascend or descend. In an embodiment, the rotating member may include, for example, a motor for rotating the display panel assembly 110 by about 180 degrees in interlock with the ascending/descending member, and the like.

However, the configuration of the buffer unit 124 is not limited thereto, but the buffer unit 124 may have any component capable of rotating the display panel assembly 110 by 180 degrees such that upper and lower sides of the display panel assembly 110 are reversed.

In an embodiment, each of the ACF attachment unit 121, the preliminary compression unit 122, the primary compression unit 123 and the buffer unit 124 may include or be configured with a conveyor that accommodates the display panel assembly 110 and is transferable in both directions. Each of the conveyors of the ACF attachment unit 121, the preliminary compression unit 122, the primary compression unit 123 and the buffer unit 124 transfers (firstly transfers) the display panel assembly 110 in a first direction (i.e., a direction from the gate adhesion unit 11 to the PCB adhesion process unit 20) during the first TAB process and the second TAB process. In an embodiment, each of the conveyors of the ACF attachment unit 121, the preliminary compression unit 122, the primary compression unit 123 and the buffer unit 124 retransfers (secondly transfers) the display panel assembly 110 in a second direction (i.e., a direction from the PCB adhesion process unit 20 to the gate adhesion unit 11) during a conveying process between the first TAB process and the second TAB process.

In an embodiment, as shown in FIG. 4, the buffer unit 124 may be provided between the gate adhesion unit 11 and the ACF attachment unit 121, but the disclosure is not limited thereto. In an alternative embodiment, the buffer unit 124 may be provided between the primary compression unit 123 and the PCB adhesion process unit 20 as shown in FIG. 5.

In an embodiment, when the buffer unit 124 is provided between the gate adhesion unit 11 and the ACF attachment unit 121, the display panel assembly 110 is transferred via the primary compression unit 123, the preliminary compression unit 122 and the ACF attachment unit 121 during the above-described transferring process, to be transferred to the buffer unit 124. The buffer unit 124 may rotate the retransferred display panel assembly 110.

In such an embodiment, when the buffer unit 124 is provided between the primary compression unit 123 and the PCB adhesion process unit 20, the buffer unit 124 rotates the display panel assembly 110 during the above-described transferring process and then retransfers the rotated display panel assembly 110 to the primary compression unit 123. Then, the rotated display panel assembly 110 is conveyed via the primary compression unit 123, the preliminary compression unit 122 and the ACF attachment unit 121.

The PCB adhesion process unit 20 performs a process of allowing the PCB to be adhered to the first COF and the second COF, which are attached onto the display panel assembly 110 transferred from the COF adhesion process unit 10. The adhesion of the PCB may be performed using a method identical or similar to that used for the source driving circuit 320, but a detailed process method is not particularly limited.

FIGS. 6 to 9 are plan views illustrating a bonding method according to an embodiment of the disclosure.

Referring to FIGS. 1 to 9, an embodiment of the bonding method may include a first TAB process, a retransferring process and a second TAB process. The display panel assembly 110 is transferred in the first direction (i.e., the direction from the gate adhesion unit 11 to the PCB adhesion process unit 20) during the first TAB process and the second TAB process, and is transferred in the second direction (i.e., the direction from the PCB adhesion process unit 20 to the gate adhesion unit 11) during the retransferring process.

Figure 6:
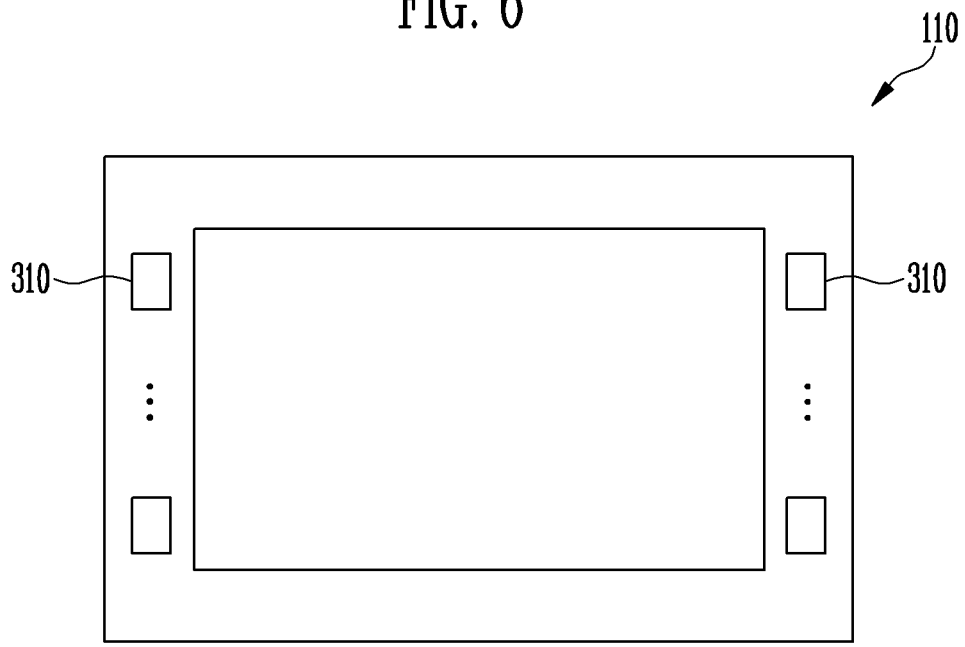
FIGS. 6 to 9 are plan views illustrating a bonding method according to an embodiment of the disclosure.

During the first TAB process, the display panel assembly 110 is transferred to the ACF attachment unit 121 in a state in which the gate driving circuit 310 is attached by the gate adhesion unit 11 as shown in FIG. 6. In an embodiment, as shown in FIG. 6, the gate driving circuit 310 is attached to both sides of the display panel assembly 110, but not being limited thereto. Alternatively, the gate driving circuit 310 may be attached to only one side of the display panel assembly 110.

The display panel assembly 110 is transferred in a state in which side surfaces, at which the source connection pads SP1 and SP2 are formed, are aligned adjacent to the first ACF transfer unit 125. In an embodiment, when the buffer unit 124 between the gate adhesion unit 11 and the ACF attachment unit 121, the display panel assembly 110 may be transferred to the ACF attachment unit 121 via the buffer unit 124.

During the first TAB process, the ACF attachment unit 121 attaches a first ACF transferred from the first ACF transfer unit 125 to the first source connection pad SP1 on the display panel assembly 110.

Figure 7:
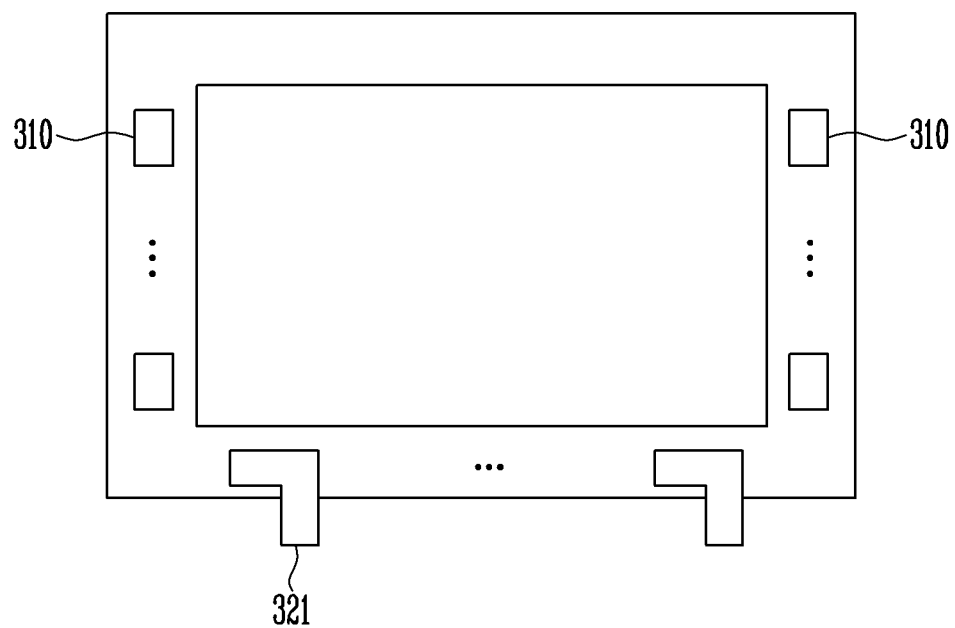

The preliminary compression unit 122 preliminarily compresses a first COF transferred from the first COF transfer unit 127 on the first ACF, and the primary compression unit 123 primarily compresses the first COF. The first COF is used to form a first source driving circuit 321, and may include a conductive lead line to be electrically connected to the first source connection pad SP1. The first COF attached on the display panel assembly 110 by such a process is illustrated in FIG. 7.

The retransferring process is performed after the first TAB process. The display panel assembly 110 is rotated and retransferred during the retransferring process.

In an embodiment, as shown in FIG. 4, the display panel assembly 110 is conveyed to the buffer unit 124 via the preliminary compression unit 122 and the ACF attachment unit 121 from the primary compression unit 123 after the first COF is primarily compressed. The buffer unit 124 rotates the retransferred display panel assembly 110 by 180 degrees and then transfers the rotated display panel assembly 110 to the ACF attachment unit 121.

In an alternative embodiment, as shown in FIG. 5, the display panel assembly 110 is transferred to the buffer unit 124 after the first COF is primarily compressed. The buffer unit 124 rotates the conveyed display panel assembly 110 by 180 degrees. Subsequently, the rotated display panel assembly 110 is retransferred to the ACF attachment unit 121 via the primary compression unit 123 and the preliminary compression unit 122 from the buffer unit 124.

Figure 8:
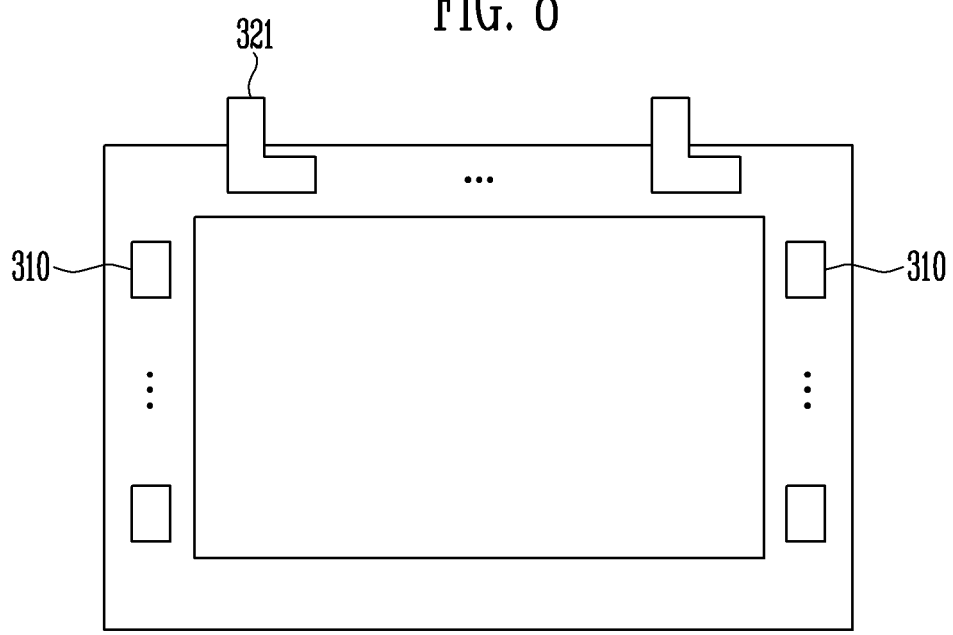

The upper and lower sides of the display panel assembly 110 are reversed by the rotation as shown in FIG. 8, so that the side surfaces, at which the source connection pads SP1 and SP2 are formed, are aligned adjacent to the second ACF transfer unit 126.

The second TAB process is performed after the retransferring process. During the second TAB process, the ACF attachment unit 121 attaches a second ACF transferred from the second ACF transfer unit 126 to the second source connection pad SP2 on the display panel assembly 110. The first ACF and the first COF, which are attached in the first TAB process, are interposed between the second ACF and the second source connection pad SP2.

Figure 9:
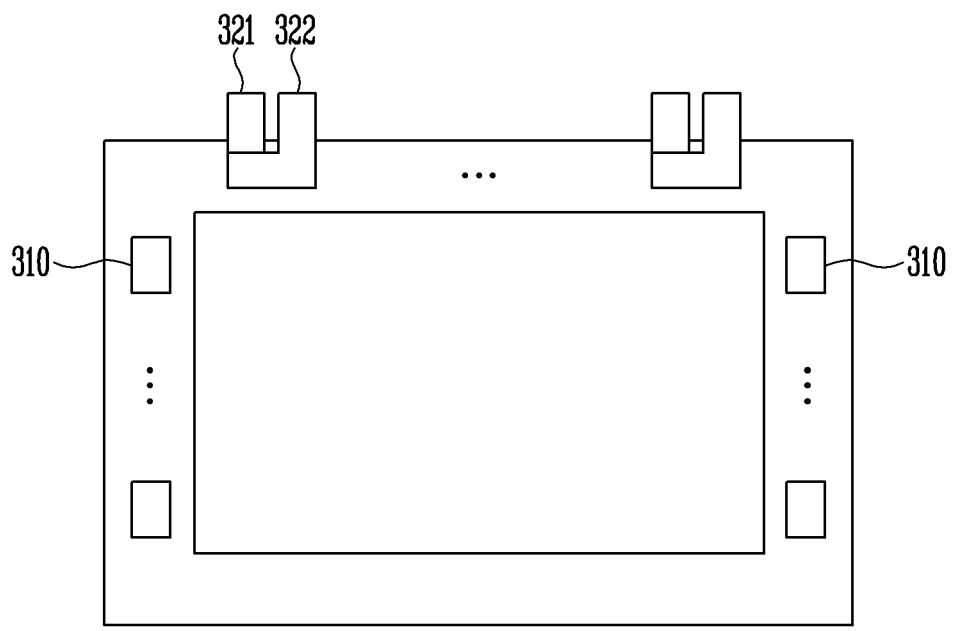

The preliminary compression unit 122 preliminarily compresses a second COF transferred from the second COF transfer unit 128 on the second ACF, and the primary compression unit 123 primarily compresses the preliminarily compressed second COF. The second COF is used to form the second source driving circuit 322, and may include a conductive lead line to be electrically connected to the second source connection pad SP2. The second COF attached onto the display panel assembly 110 by such a process is illustrated in FIG. 9.

After the source driving circuits 321 and 322 are adhered onto the display panel assembly 110 as described above, the display panel assembly 110 may be transferred to the PCB adhesion process unit 20.

As described above, according to embodiments of the disclosure, a bonding process may be efficiently performed while not increasing the layout of bonding process facilities through two TAB processes and a retransferring process provided therebetween.

Herein, the bonding process for the source driving circuit are described in detail. However, such bonding process may be applied for the gate driving circuit and PCB adhesion without departing from the technical spirit and scope of the disclosure.

In embodiments of the bonding apparatus and the bonding method according to the disclosure, the layout of process facilities may be reduced in a TAB process of a COF.

Exemplary embodiments of the invention have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the invention as set forth in the following claims.

What is claimed is:

1. A bonding method comprising:
    performing a first tape automated bonding process including attaching a first anisotropic conductive film and a first chip-on-film onto a first source connection pad of a display panel assembly while the display panel assembly is transferred in a first direction;
    performing a retransferring process including conveying the display panel assembly, onto which the first chip-on-film is bonded through the first tape automated bonding process, in a second direction opposite to the first direction, and rotating the display panel assembly, onto which the first chip-on-film is bonded through the first tape automated bonding process, on a plane; and
    performing a second tape automated bonding process including attaching a second anisotropic conductive film and a second chip-on-film onto a second source connection pad of the display panel assembly, onto which the first chip-on-film is bonded through the first tape automated bonding process, while the rotated display panel assembly is retransferred in the first direction, wherein the attaching the second chip-on-film onto the display panel assembly includes disposing the second chip-on-film to partially overlap the first chip-on-film,
wherein the second chip-on-film has an area wider than that of the first chip-on-film, and
wherein the first source connection pad and the second source connection pad are diagonally spaced from each other in a plan view.

2. The bonding method of claim 1, wherein the first tape automated bonding process, and the second tape automated bonding process are performed by conveying the display panel assembly in the first direction and the second direction.

3. The bonding method of claim 1, wherein the performing the first tape automated bonding process includes:
attaching the first anisotropic conductive film to a first source connection pad on the display panel assembly; and
compressing preliminarily the first chip-on-film on the first anisotropic conductive film.

4. The bonding method of claim 3, wherein the performing the first tape automated bonding process further includes:
compressing primarily the preliminarily compressed first chip-on-film.

5. The bonding method of claim 3, wherein the first chip-on-film is used to form a first source driving circuit.

6. The bonding method of claim 5, wherein the first source driving circuit is electrically connected to the first source connection pad through the first anisotropic conductive film.

7. The bonding method of claim 1, wherein the performing the retransferring process includes:
retransferring, in the second direction, the display panel assembly transferred in the first direction;
rotating the retransferred display panel assembly by about 180 degrees; and
transferring the rotated display panel assembly in the first direction.

8. The bonding method of claim 1, wherein the performing the retransferring process includes:
rotating the display panel assembly transferred in the first direction; and
retransferring the display panel assembly in the second direction.

9. The bonding method of claim 1, wherein the performing the second tape automated bonding process includes:
attaching the second anisotropic conductive film to a second source connection pad on the display panel assembly; and
compressing preliminarily the second chip-on-film on the second anisotropic conductive film.

10. The bonding method of claim 9, wherein the performing the second tape automated bonding process further includes:
compressing primarily the preliminarily compressed second chip-on-film.

11. The bonding method of claim 9, wherein the second chip-on-film is used to form a second source driving circuit.

12. The bonding method of claim 11, wherein the second source driving circuit is electrically connected to the second source connection pad through the second anisotropic conductive film.

13. The bonding method of claim 1, wherein the display panel assembly is transferred in the first direction during the first tape automated bonding process,
wherein the retransferring process is performed after the first tape automated bonding process,
wherein the second tape automated bonding process is performed after the retransferring process, and
wherein the rotated display panel assembly is retransferred in the first direction during the second tape automated bonding process.

14. The bonding method of claim 1, further comprising bonding a printed circuit board to the first chip-on-film and the second chip-on-film.

15. The bonding method of claim 14, wherein the first chip-on-film and the second chip-on-film partially overlap on the display panel assembly, and does not overlap on the printed circuit board.

16. The bonding method of claim 1, wherein the first tape automated bonding process is performed on a lower side of the display panel assembly in the plan view, and
wherein the second tape automated bonding process is performed on an upper side of the display panel assembly in the plan view.

17. The bonding method of claim 16, wherein the first chip-on-film and the second chip-on-film are bonded to a same side of the display panel assembly.

18. A bonding method comprising:
performing a first tape automated bonding process including attaching a first anisotropic conductive film onto a first source connection pad of a display panel assembly, and compressing a first chip-on-film on the first anisotropic conductive film, while the display panel assembly is transferred in a first direction;
performing a retransferring process including retransferring the display panel assembly in a second direction opposite to the first direction, and rotating the display panel assembly on a plane; and
performing a second tape automated bonding process including attaching a second anisotropic conductive film onto a second source connection pad of the display panel assembly, and compressing a second chip-on-film on the second anisotropic conductive film, while the rotated display panel assembly is transferred in the first direction,
wherein the compressing the second chip-on-film on the second anisotropic conductive film includes disposing the second chip-on-film to partially overlap the first chip-on-film,
wherein the second chip-on-film has an area wider than that of the first chip-on-film, and
wherein the first source connection pad and the second source connection pad are diagonally spaced from each other in a plan view.

* * * * *